United States Patent
Yu

(10) Patent No.: US 12,220,891 B2
(45) Date of Patent: Feb. 11, 2025

(54) HOT-PRESSING MEMBER WITH IMPROVED FOCUS OF PRESSING AND LONGEVITY AND HOT-PRESSING DEVICE

(71) Applicant: TRIPLE WIN TECHNOLOGY(SHENZHEN) CO.LTD., Shenzhen (CN)

(72) Inventor: Fei-Fan Yu, Shenzhen (CN)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 405 days.

(21) Appl. No.: 17/704,295

(22) Filed: Mar. 25, 2022

(65) Prior Publication Data
US 2023/0123108 A1  Apr. 20, 2023

(30) Foreign Application Priority Data
Oct. 18, 2021  (CN) .......................... 202111210345.6

(51) Int. Cl.
*B30B 15/06* (2006.01)
*H01L 23/00* (2006.01)

(52) U.S. Cl.
CPC .......... *B30B 15/061* (2013.01); *B30B 15/064* (2013.01); *H01L 24/75* (2013.01); *H01L 2224/7555* (2013.01)

(58) Field of Classification Search
CPC ... B30B 15/061; B30B 15/062; B30B 15/064; H01L 24/75; H01L 2224/7555
See application file for complete search history.

(56) References Cited

U.S. PATENT DOCUMENTS

| | | | | |
|---|---|---|---|---|
| 2009/0266492 A1* | 10/2009 | Takeuchi | ............ | H05K 3/4611 |
| | | | | 156/583.1 |
| 2014/0048997 A1* | 2/2014 | Cheng | .................... | H04N 23/57 |
| | | | | 269/303 |

* cited by examiner

*Primary Examiner* — George R Koch
(74) *Attorney, Agent, or Firm* — ScienBiziP, P.C.

(57) ABSTRACT

A hot-pressing member proofed against thinning and shearing forces caused by laterally overflowing during pressing operations includes a base with cavity, a first supporting member in the cavity, a buffer member, and a second supporting member. The first supporting member includes first through hole. The buffer member includes a second through hole. The second supporting member is mounted on the buffer member. The second supporting member with third through hole supports the workpiece. The workpiece or part is in the third, second, and first through holes, and is hot-pressed with the adhesive film in a centered and constrained manner through all the through holes. The disclosure also provides a hot-pressing device having the hot-pressing member.

16 Claims, 3 Drawing Sheets

HOT-PRESSING MEMBER WITH IMPROVED FOCUS OF PRESSING AND LONGEVITY AND HOT-PRESSING DEVICE

FIELD

The subject matter herein generally relates to a hot-pressing member and a hot-pressing device having the hot-pressing member.

BACKGROUND

Electronic devices, such as lens modules, may include chips and flexible circuit boards. An anisotropic conductive film (ACF film) may be sandwiched between the chip and the flexible circuit board. Such an ACF film includes multiple conductive particles. In a hot-pressing procedure, the conductive particles are crushed to realize electrical connection between the chip and the flexible circuit board.

In order to ensure that an external force on the ACF film is uniform, a buffer pad is set in a loading plate of the hot-pressing device. However, the buffer pad may deform after for long usage, and the edge of the buffer pad may overflow out of a hot-pressing area. Therefore, whether a buffer pad is overflowed needs to be checked before the hot-pressing process, which affects efficiency.

BRIEF DESCRIPTION OF THE DRAWINGS

Implementations of the present disclosure will now be described, by way of embodiments, with reference to the attached figures.

DETAILED DESCRIPTION

Figure 1:
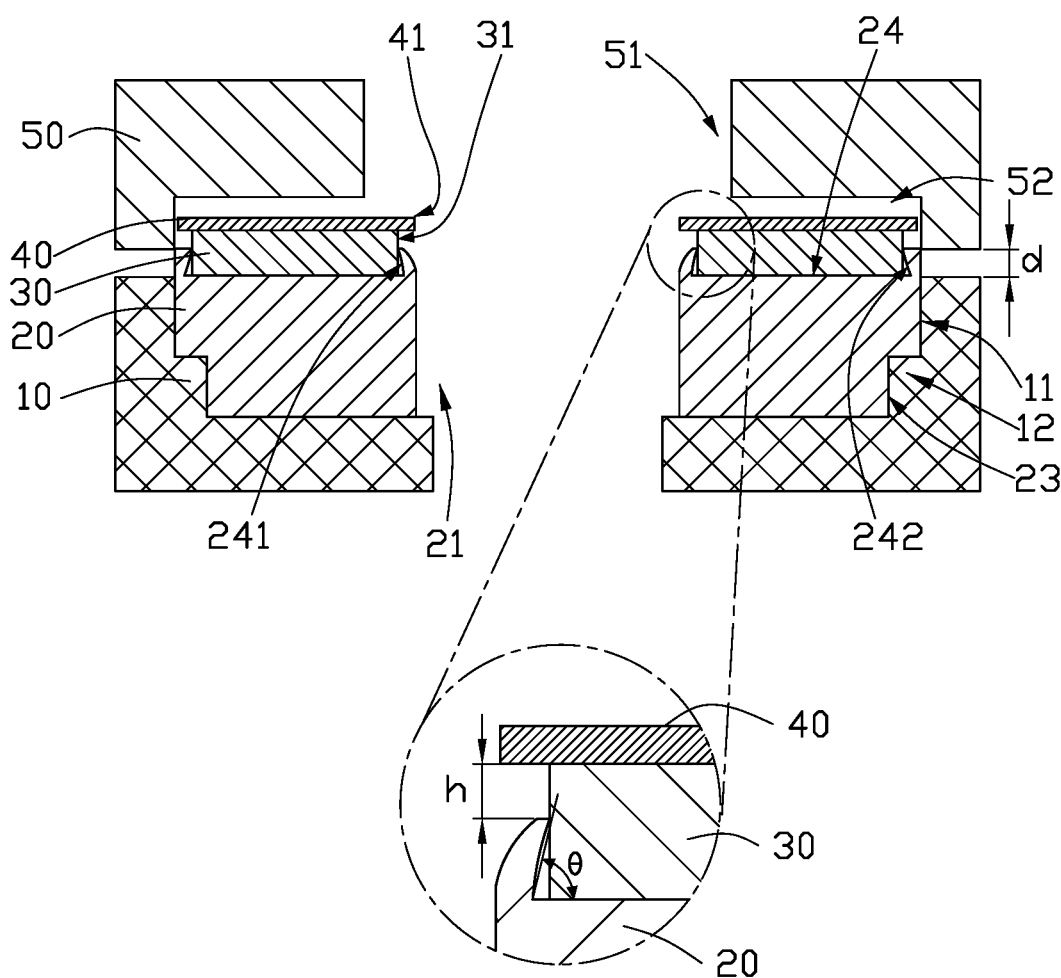
FIG. 1 is a cross-sectional view of an embodiment of a hot-pressing member according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Figure 2:
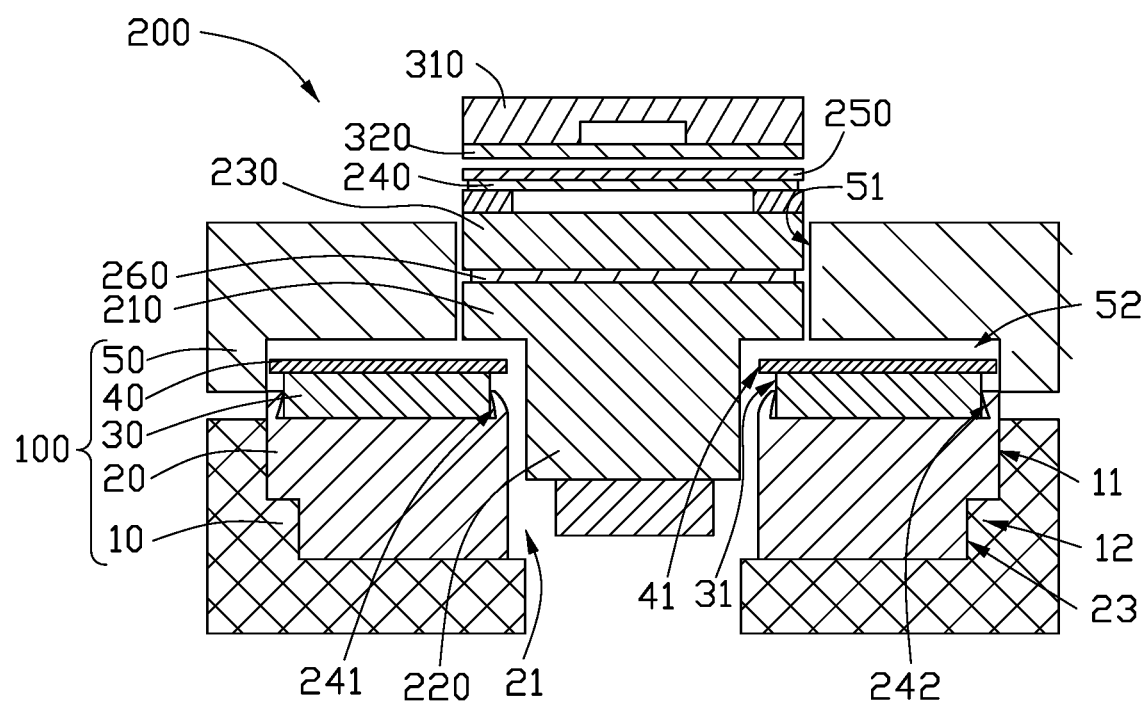
FIG. 2 is a cross-sectional view of an embodiment of a hot-pressing device having the hot-pressing member of FIG. 1.

FIGS. 1 and 2 illustrate an embodiment of a hot-pressing member 100. The hot-pressing member 100 supports a workpiece 200, and a hot-pressing procedure needs to be performed to an adhesive film 240 in the workpiece 200.

In at least one embodiment, the hot-pressing member 100 includes a base 10, a first supporting member 20, a buffer member 30, a second supporting member 40 and a cover plate 50.

The base 10 includes a cavity 11. The first supporting member 20 is received in the cavity 11. The cover plate 50 is mounted on the base 10. The buffer member 30 is mounted on the first supporting member 20. The first supporting member 20 includes a surface close to the buffer member 30, and a portion of the surface surrounding the first supporting member 20 is recessed inwardly to form a concave portion 24. A portion of the buffer member 30 is received in the concave portion 24, the remaining portion of the buffer member 30 protrudes from the concave portion 24. The second supporting member 40 is mounted on the buffer member 30. In applying an external force to the adhesive film 240, the buffer member 30 ensures overall uniformity of pressure on the adhesive film 240.

Referring to FIG. 2, in at least one embodiment, the workpiece 200 is a lens module. The lens module includes a lens holder 210, a lens 220 mounted on the lens holder 210, a base 230 mounted on a surface of the lens holder 210 away from the lens 220, and the adhesive film 240 mounted on a surface of the base 230 away from the lens 220. In at least one embodiment, the lens module further includes an adhesive layer 260. The adhesive layer 260 is located between the lens holder 210 and the base 230. A flexible plate 250 is located on the adhesive film 240, and electrical conductivity between the flexible plate 250 and other electronic components (not shown) in the lens module is realized by the adhesive film 240.

Figure 3:
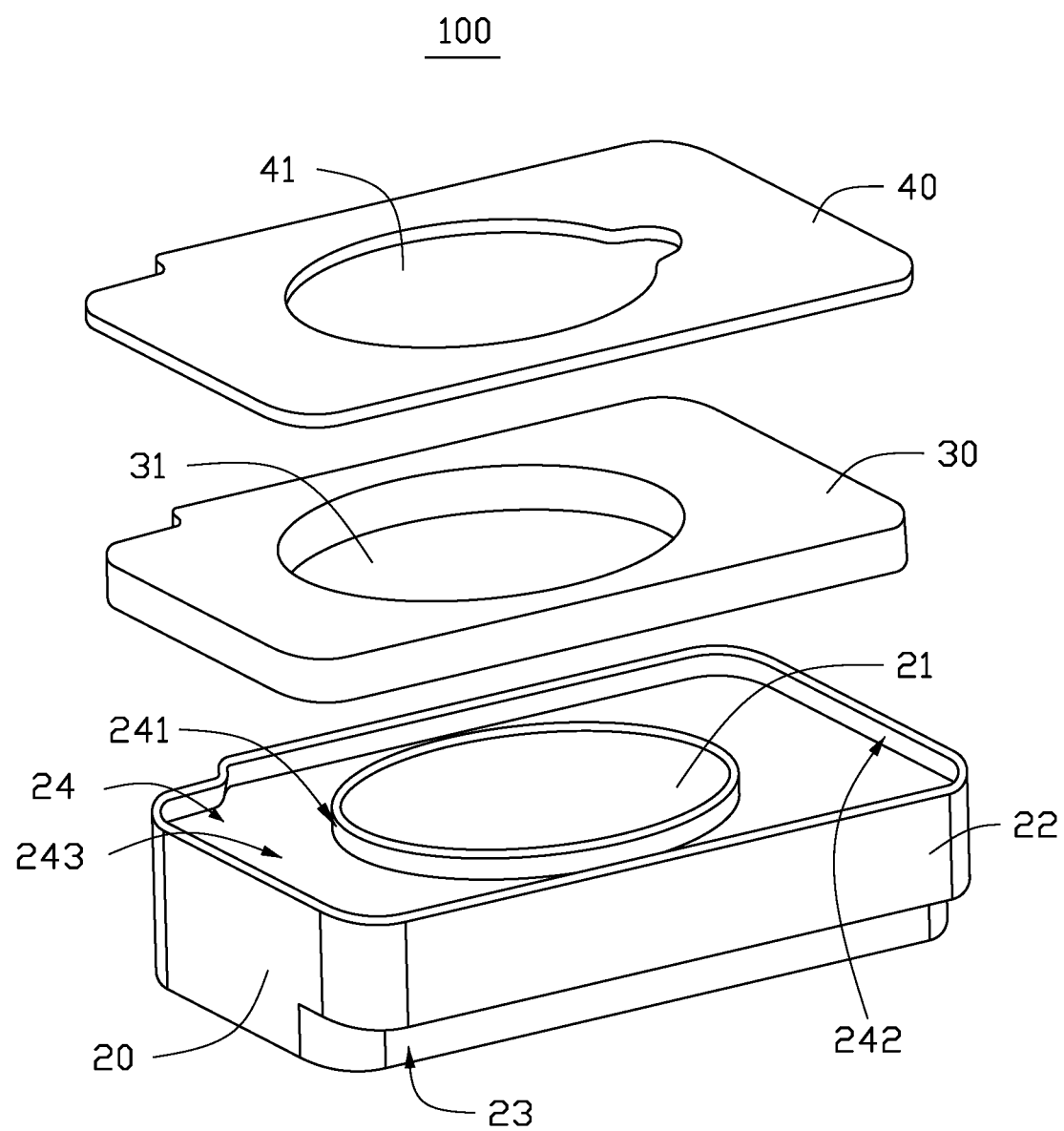
FIG. 3 is a partial exploded view of the hot-pressing member of FIG. 1.

Referring to FIGS. 2 and 3, the first supporting member 20 includes a first through hole 21. The buffer member 30 includes a second through hole 31. The second supporting member 40 includes a third through hole 41. The first through hole 21, the second through hole 31, and the third through hole 41 are coaxial. An inner diameter of the third through hole 41 is smaller than that of the second through hole 31. Before hot-pressing the adhesive film 240 in the workpiece 200, a portion of the workpiece 200 is passed through the third through hole 41. That is, the lens 220 passes through the third through hole 41, the second through hole 31, and a portion of the first through hole 21. The outer diameter of the lens holder 210 is greater than the inner diameter of the third through hole 41. Therefore, the lens holder 210 is located on and connected to the second supporting member 40, and the adhesive film 240 is located above the second supporting member 40 to position the workpiece 200.

When hot-pressing the adhesive film 240 in the workpiece 200, external force is applied downward on the adhesive film 240 to compress and melt the adhesive film 240. The workpiece 200 is pressed, which further delivers the force to the second bearing member 40 through the lens holder 210. Then, the second supporting member 40 presses the buffer member 30, so that the buffer member 30 is compressed and may be squeezed out and overflow along the horizontal direction. At this time, the concave portion 24 limits the degree of overflow of the block the buffer member 30 along the horizontal direction, which allows the buffer member 30 to rebound and prevents the buffer member 30 from overflowing along the horizontal direction. Thus, a service life of the buffer member 30 is improved. Furthermore, the uniformity of pressure on the adhesive film 240 is also improved, so that conductive particles in the adhesive film 240 are uniformly crushed to achieve electrical conductivity.

In at least one embodiment, the first supporting member 20 includes an annular outer wall 22. A portion of the outer wall 22 includes a groove 23. The first supporting member 20 is in contact with an inner wall of the cavity 11. The inner wall of the cavity 11 is provided with a convex plate 12, which is received in the groove 23. The convex plate 12 improves a centering and containment of area between the base 10 and the first supporting member 20, so that the stability of the connection of the base 10 and the first supporting member 20 is improved. In at least one embodiment, the first supporting member 20 is substantially square. In at least one embodiment, the first supporting member 20 is made of aluminum or aluminum alloy. The cavity 11 is substantially square to correspond to the shape of the first supporting member 20, so that the first supporting member 20 matches the inner wall of the cavity 11.

In at least one embodiment, the concave portion 24 includes the first inner wall 241 and the second inner wall 242 facing the first inner wall 241. The first inner wall 241 is adjacent to the first through hole 21. The first inner wall 241, the second inner wall 242 and a bottom wall 243 together form the concave portion 24. The concave portion 24 is also substantially square. The concave portion 24 includes the bottom wall 243. Both the first inner wall 241 and the second inner wall 242 are inclined to the bottom wall 243. Specifically, along a direction from the buffer member 30 to the second supporting member 40, a distance between the first inner wall 241 and the second inner wall 242 gradually decreases. In at least one embodiment, the inclined angle of the first inner wall 241 and the inclined angle of the second inner wall 242 are the same or can be different from each other. In an embodiment, the inclined angle θ of each of the first inner wall 241 and the second inner wall 242 is in a range of 10° to 80°, so as to better prevent the overflow of the buffer member 30 along the horizontal direction.

In at least one embodiment, the buffer member 30 is also substantially square and matches with the concave portion 24. The buffer member 30 is placed in the concave portion 24, and a portion of it extends out of the concave portion 24. A side wall of the buffer member 30 is connected to the end of the first inner wall 241 and the second inner wall 242 away from the bottom wall 243, to limit the position of the buffer member 30 in the concave portion 24. In at least one embodiment, a ratio of a depth (d) of the concave portion 24 with respect to a height (h) of the buffer member 30 protruding from the concave portion 24 is 60% to 80%, so as to allow a better rebounding by the buffer member 30 after being pressed. In at least one embodiment, the buffer member 30 is made of silicone rubber, or other elastic and resilient polymer material.

The second supporting member 40 is mounted on the buffer member 30, and the cover plate 50 is mounted on the second supporting member 40, so as to better define the position of the second supporting member 40. The cover plate 50 includes a fourth through hole 51. The fourth through hole 51 and the third through hole 41 are coaxial. An inner diameter of the fourth through hole 51 is greater than an inner diameter of the third through hole 41, so that the workpiece 200 can pass through the fourth through hole 51 and be partially connected to the second supporting member 40. For example, the lens 220 passes through the third through hole 41, and the lens holder 210 is received in the fourth through hole 51 and connected to the top surface of the second supporting member 40. The edge of the cover plate 50 is bent towards the buffer member 30 to form a receiving groove 52 for receiving the second supporting member 40 and a part of the buffer member 30. The receiving groove 52 is connected to and corresponds to the cavity 11, so that the first supporting member 20, the buffer member 30, and the second supporting member 40 can be disposed between the base 10 and the cover plate 50. In at least one embodiment, the second supporting member 40 is made of steel, is substantially square, and corresponds to the size of the buffer member 30.

FIG. 2 illustrates an embodiment of a hot-pressing device 300. In at least one embodiment, the hot-pressing device 300 includes a hot-pressing head 310 and the hot-pressing member 100. The hot-pressing head 310 is mounted on the hot-pressing member 100 and used to compress and melt the adhesive film 240 in the workpiece 200. The specific operation process of forming the adhesive film 240 on workpiece 200 through hot-pressing is carried out as follows. Firstly, a clamping mechanism (not shown) is used to clamp the workpiece 200. The workpiece 200 is put into the fourth through hole 51, and the lens 220 in the workpiece 200 is passed through the third through hole 41, the second through hole 31, and a portion of the first through hole 21. Then, the hot-pressing head 310 with a certain temperature is applied on the flexible plate 250 of the workpiece 200. The adhesive film 240 is melted and flows under the certain temperature, bonding the flexible plate 250 and electronic components together. Then, the adhesive film 240 is cooled and solidified, and the electronic components and the flexible plate 250 are electrically connected to each other through the conductive particles in the adhesive film 240. Between the hot-pressing head 310 and the flexible plate 250, there is also a silica gel belt 320 to improve a flatness of the adhesive film 240.

In the disclosure, the performance of the buffer member 30 is also tested. The tensile strength of the buffer member 30 is greater than 9.6 mpa, the tear strength is greater than 36 N/mm, the permanent deformation rate is 5%, and the hardness is 65°+/5°. The thickness of the buffer member 30 is 0.8 mm, and the depth of the concave portion 24 is 0.5 mm. That is, the height of the buffer member 30 extending into the concave portion 24 is 0.3 mm, and the inclined angles of the first inner wall 241 and the second inner wall 242 are both 80°.

In the present disclosure, the concave portion 24 is mounted on the first supporting member 20, the first supporting member 20 receiving the buffer member 30 and preventing an excess overflow of the buffer member 30. Therefore, the pressure on the rubber film 240 on the workpiece 200 is uniformly distributed during the hot pressing, and the conductive particles in the adhesive film 240 are crushed to achieve electrical conductivity. Receiving the buffer member 30 in the concave portion 24 also reduces thinning and shearing forces which cause damage to the buffer member 30, facilitates the rebound of the buffer member 30, and improves the service life of the buffer member 30. Therefore, production efficiency and yield of workpiece 200 is improved.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A hot-pressing member comprising:
a base comprising a cavity;
a first supporting member received in the cavity, the first supporting member comprising a first through hole;
a buffer member comprising a second through hole, the first supporting member comprising a surface close to the buffer member, and a portion of the surface surrounding the first supporting member being recessed inwardly to form a concave portion, the buffer member received in the concave portion; and
a second supporting member mounted on the buffer member, the second supporting member used to support a workpiece having an adhesive film, the second supporting member comprising a third through hole, the second through hole communicating with the first through hole and the third through hole, thereby allowing a portion of the workpiece to pass through the third through hole, the second through hole, and a portion of the first through hole, to hot-press the adhesive film in the workpiece;
wherein the concave portion comprises a first inner wall and a second inner wall facing the first inner wall, the first inner wall is near the first through hole, the concave portion comprises the bottom wall, both the first inner wall and the second inner wall are inclined to the bottom wall, along a direction from the buffer member to the second supporting member, a distance between the first inner wall and the second inner wall decreases.

2. The hot-pressing member of claim 1, wherein an inner diameter of the third through hole is smaller than that of the second through hole.

3. The hot-pressing member of claim 1, wherein a side wall of the buffer member is connected to ends of the first inner wall and the second inner wall away from the bottom wall.

4. The hot-pressing member of claim 1, wherein a ratio of a depth of the concave portion with respect to a height of the buffer member protruding from the concave portion is 60% to 80%.

5. The hot-pressing member of claim 1, wherein an inclined angle of each of the first inner wall and the second inner wall is 10 degrees to 80 degrees.

6. The hot-pressing member of claim 1, further comprising a cover plate, wherein the cover plate is mounted on the second supporting member, the cover plate comprises a fourth through hole, the fourth through hole and the third through hole are coaxial, an inner diameter of the fourth through hole is greater than an inner diameter of the third through hole.

7. The hot-pressing member of claim 1, wherein the first supporting member comprises an outer wall, a portion of the outer wall comprises a groove, a convex plate is disposed on an inner wall of the cavity, and the convex plate is disposed in the groove.

8. The hot-pressing member of claim 1, wherein the buffer member is made of a silicone rubber.

9. A hot-pressing device, comprising:
a hot-pressing head; and
a hot-pressing member comprising:
a base comprising a cavity;
a first supporting member received in the cavity, the first supporting member comprising a first through hole;
a buffer member comprising a second through hole, the first supporting member comprising a surface close to the buffer member, and a portion of the surface surrounding the first supporting member being recessed inwardly to form a concave portion, the buffer member received in the concave portion; and
a second supporting member mounted on the buffer member, the second supporting member used to support a workpiece having an adhesive film, the second supporting member comprising a third through hole, the second through hole communicating with the first through hole and the third through hole, thereby allowing a portion of the workpiece to pass through the third through hole, the second through hole, and a portion of the first through hole, to hot-press the adhesive film in the workpiece;
the concave portion comprises a first inner wall and a second inner wall facing the first inner wall, the first inner wall is near the first through hole, the concave portion comprises the bottom wall, both the first inner wall and the second inner wall are inclined to the bottom wall, along a direction from the buffer member to the second supporting member, a distance between the first inner wall and the second inner wall decreases.

10. The hot-pressing device of claim 9, wherein an inner diameter of the third through hole is smaller than that of the second through hole.

11. The hot-pressing device of claim 9, wherein a side wall of the buffer member is connected to ends of the first inner wall and the second inner wall away from the bottom wall.

12. The hot-pressing of device claim 9, wherein a ratio of a depth of the concave portion with respect to a height of the buffer member protruding from the concave portion is 60% to 80%.

13. The hot-pressing device of claim 9, wherein an inclined angle of each of the first inner wall and the second inner wall is 10 degrees to 80 degrees.

14. The hot-pressing device of claim 9, further comprising a cover plate, wherein the cover plate is mounted on the second supporting member, the cover plate comprises a fourth through hole, the fourth through hole and the third through hole are coaxial, an inner diameter of the fourth through hole is greater than an inner diameter of the third through hole.

15. The hot-pressing device of claim 9, wherein the first supporting member comprises an outer wall, a portion of the outer wall comprises a groove, a convex plate is disposed on an inner wall of the cavity, and the convex plate is disposed in the groove.

16. The hot-pressing device of claim 9, wherein the buffer member is made of a silicone rubber.

* * * * *